United States Patent
Kobayashi et al.

(10) Patent No.: US 12,198,968 B2
(45) Date of Patent: Jan. 14, 2025

(54) ELECTROSTATIC CHUCK AND SUBSTRATE FIXING DEVICE

(71) Applicant: SHINKO ELECTRIC INDUSTRIES CO., LTD., Nagano (JP)

(72) Inventors: Kentaro Kobayashi, Nagano (JP); Mizuki Watanabe, Nagano (JP); Kohei Yamaguchi, Nagano (JP); Atsuo Sato, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 215 days.

(21) Appl. No.: 17/871,237

(22) Filed: Jul. 22, 2022

(65) Prior Publication Data
US 2023/0030510 A1 Feb. 2, 2023

(30) Foreign Application Priority Data
Jul. 28, 2021 (JP) .................. 2021-123156

(51) Int. Cl.
*H01L 21/683* (2006.01)
*B28B 11/08* (2006.01)
*C04B 37/00* (2006.01)
*H01J 37/32* (2006.01)

(52) U.S. Cl.
CPC ...... *H01L 21/6833* (2013.01); *B28B 11/0863* (2013.01); *C04B 37/001* (2013.01); *H01J 37/32715* (2013.01); *H01L 21/683* (2013.01); *C04B 2235/612* (2013.01); *H01J 2237/2007* (2013.01)

(58) Field of Classification Search
CPC ........... H01L 21/6833; H01L 21/67103; H01L 21/67109; H01L 21/683; B28B 11/0863; H01J 37/32715; H01J 2237/2007; H01J 37/32724; C04B 2237/62; H02N 13/00
USPC .......................................... 361/234
See application file for complete search history.

(56) References Cited

U.S. PATENT DOCUMENTS

| | | | |
|---|---|---|---|
| 6,108,189 A * | 8/2000 | Weldon | C23C 16/4586 279/128 |
| 2013/0286532 A1 | 10/2013 | Kataigi et al. | |
| 2015/0279714 A1 * | 10/2015 | Yamaguchi | H01L 21/6831 279/128 |
| 2016/0276198 A1 * | 9/2016 | Anada | H01L 21/6831 |
| 2020/0227291 A1 * | 7/2020 | Ishikawa | H01J 37/32697 |

FOREIGN PATENT DOCUMENTS

JP 2013-232640 11/2013

* cited by examiner

*Primary Examiner* — Danny Nguyen
(74) *Attorney, Agent, or Firm* — Rankin, Hill & Clark LLP

(57) ABSTRACT

The electrostatic chuck includes an insulating substrate having a placement surface on which a suction target object is placed and an opposite surface provided on an opposite side to the placement surface; and a gas hole penetrating from the opposite surface to the placement surface. The gas hole has a first hole portion extending from the opposite surface toward the placement surface, a second hole portion extending from the placement surface toward the opposite surface, and a third hole portion provided between the first hole portion and the second hole portion and formed to communicate the first hole portion and the second hole portion each other. The first hole portion is provided not to overlap with the second hole portion in a plan view.

6 Claims, 14 Drawing Sheets

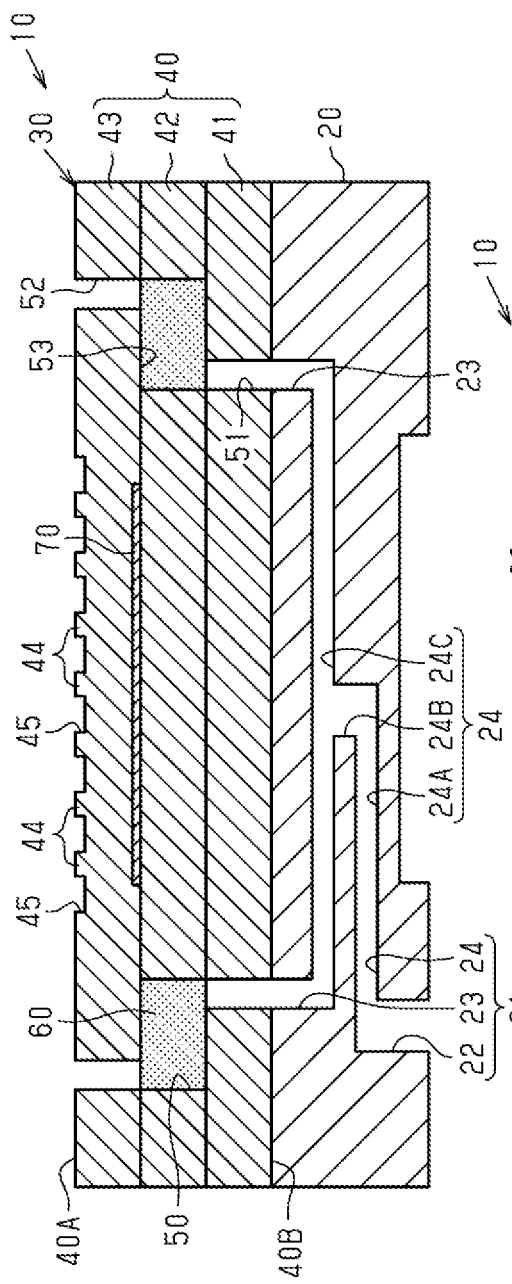
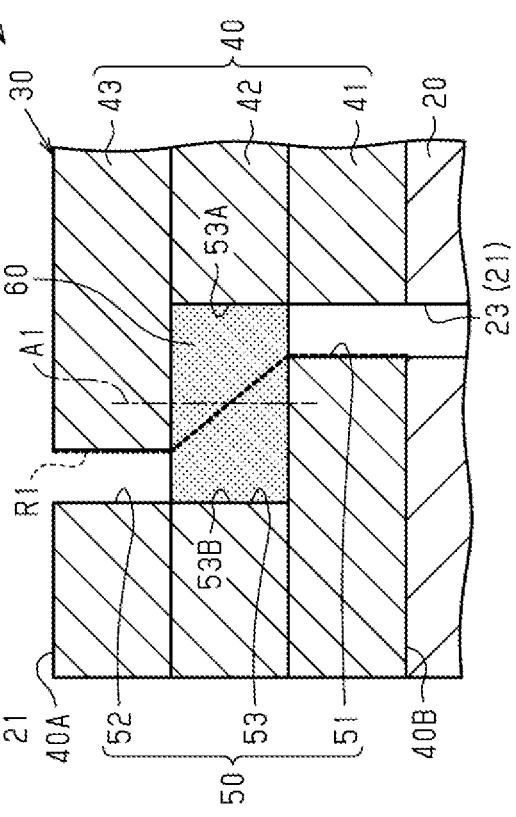
FIG. 1A
FIG. 1B

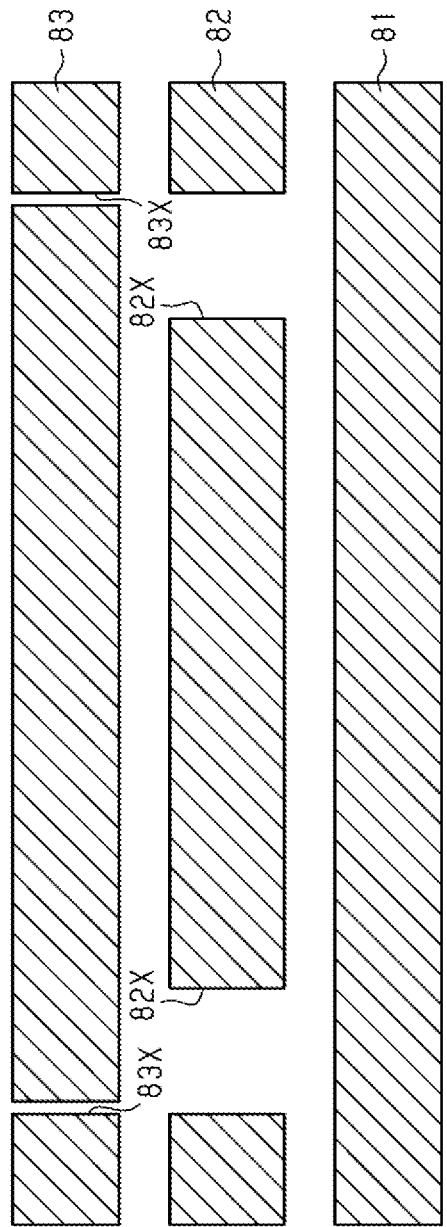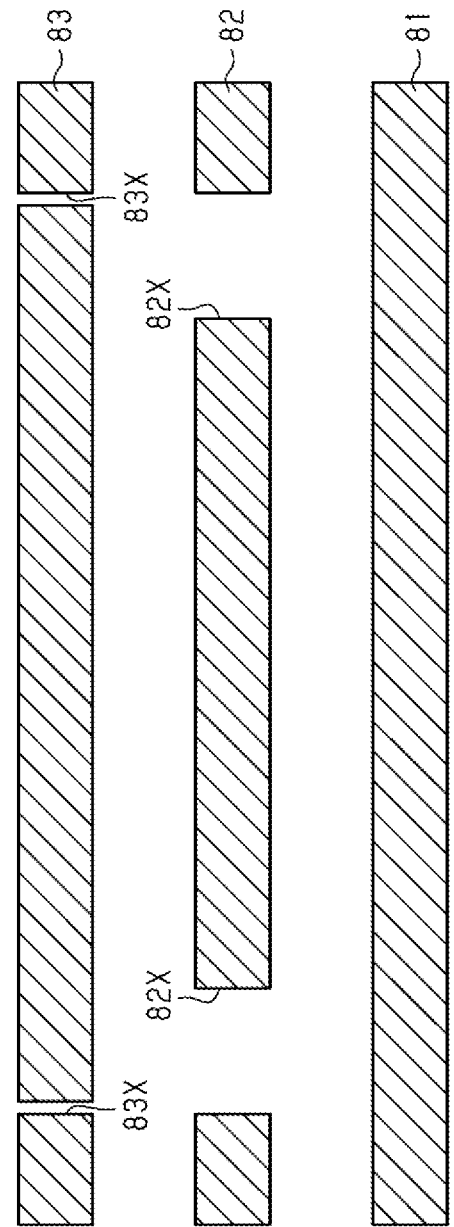

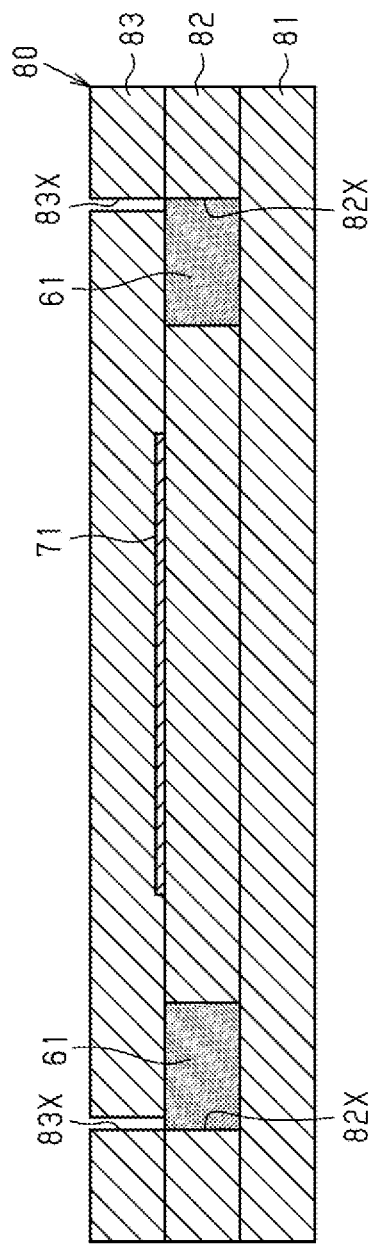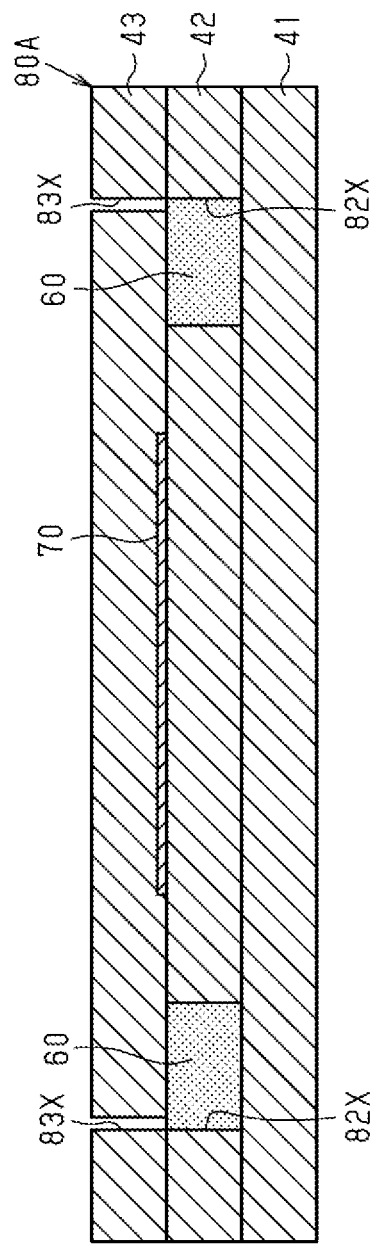
FIG. 5A
FIG. 5B

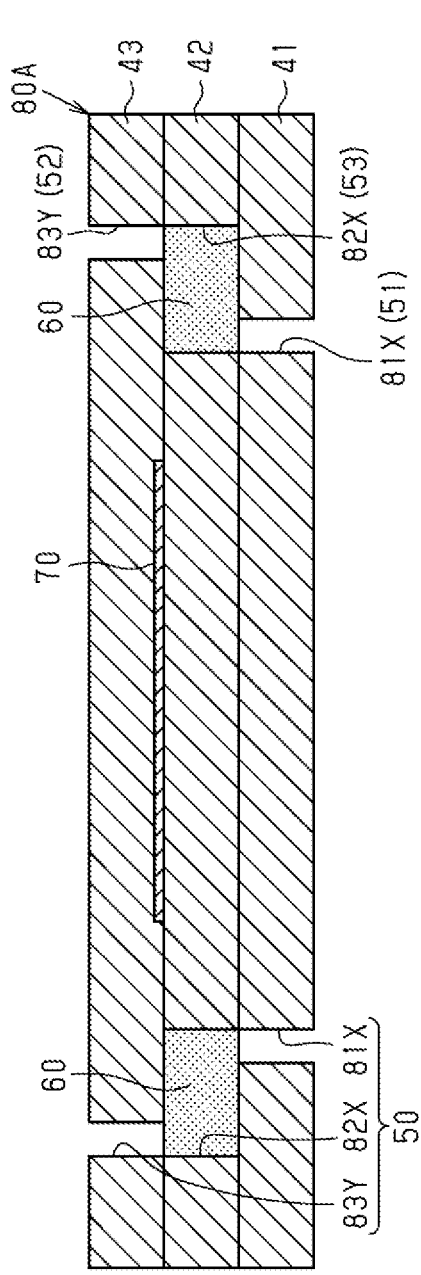
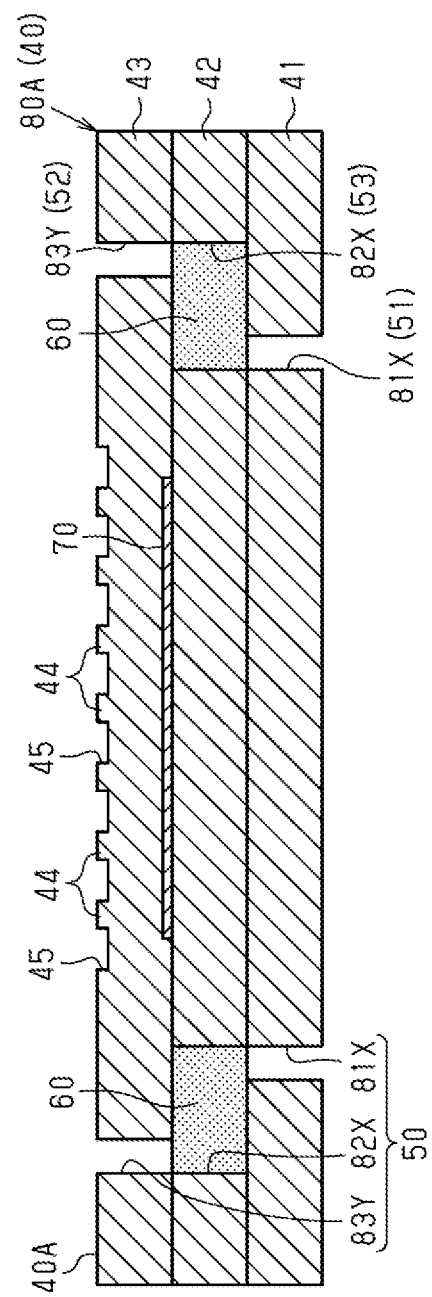

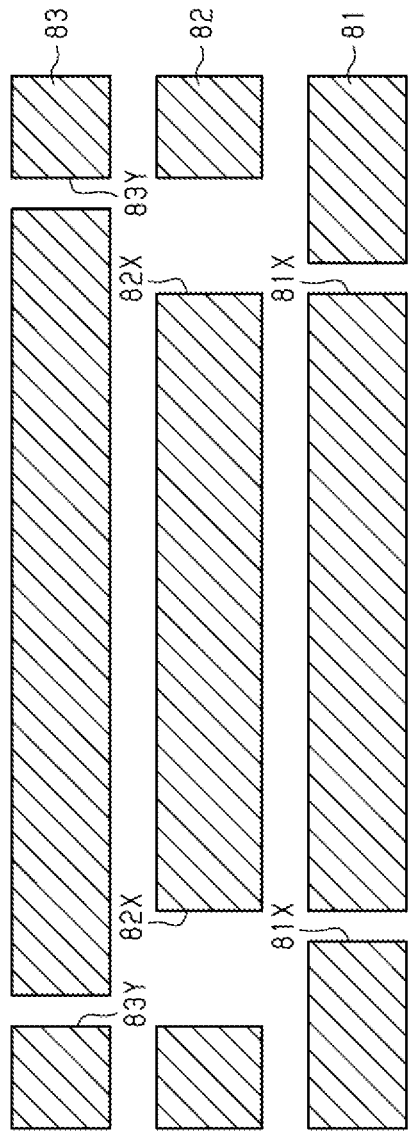 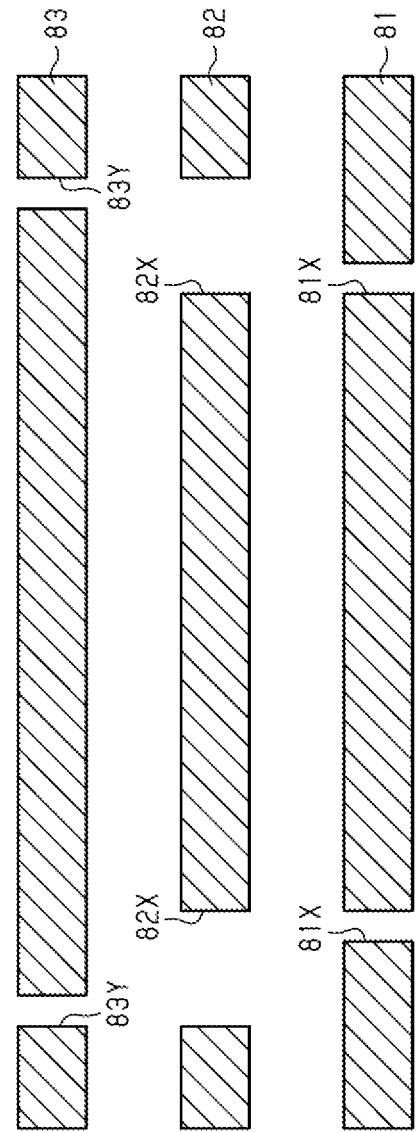
FIG. 7A
FIG. 7B

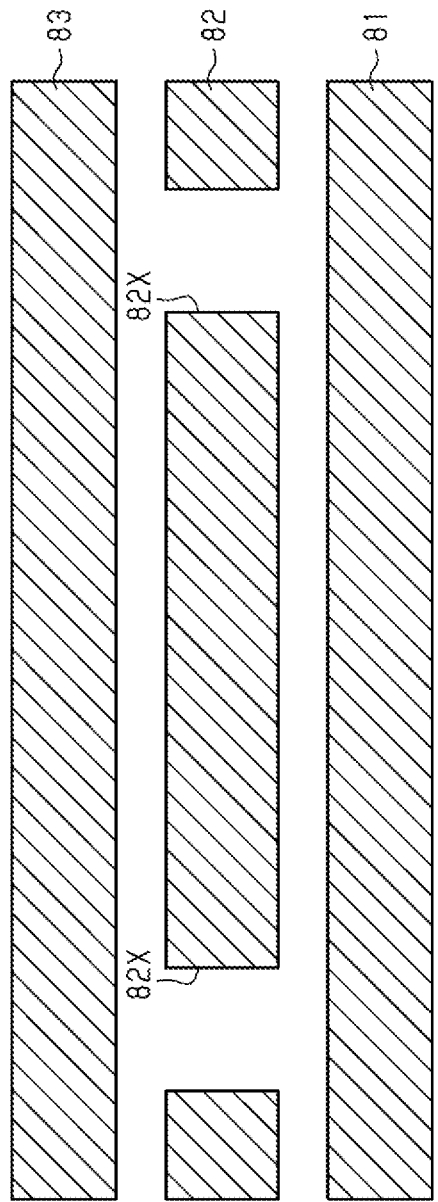
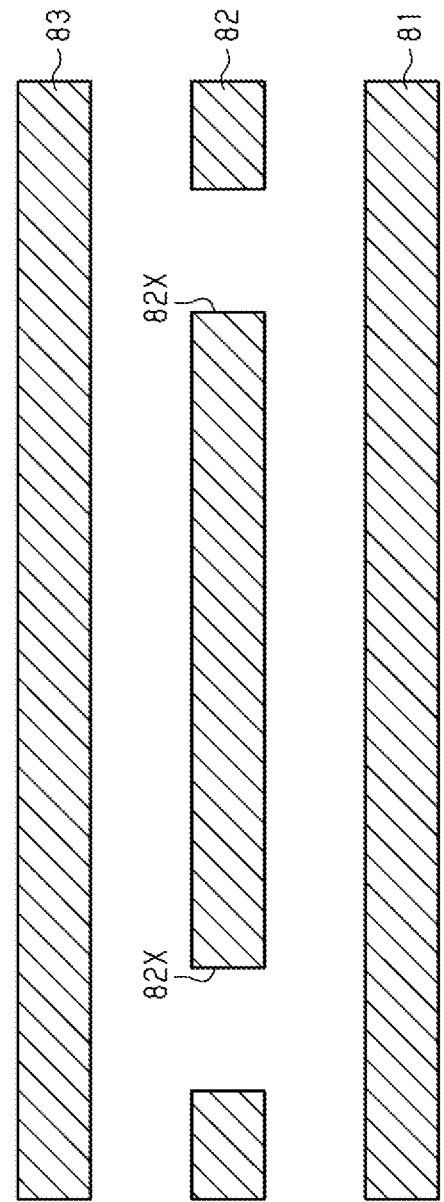
FIG. 10A
FIG. 10B

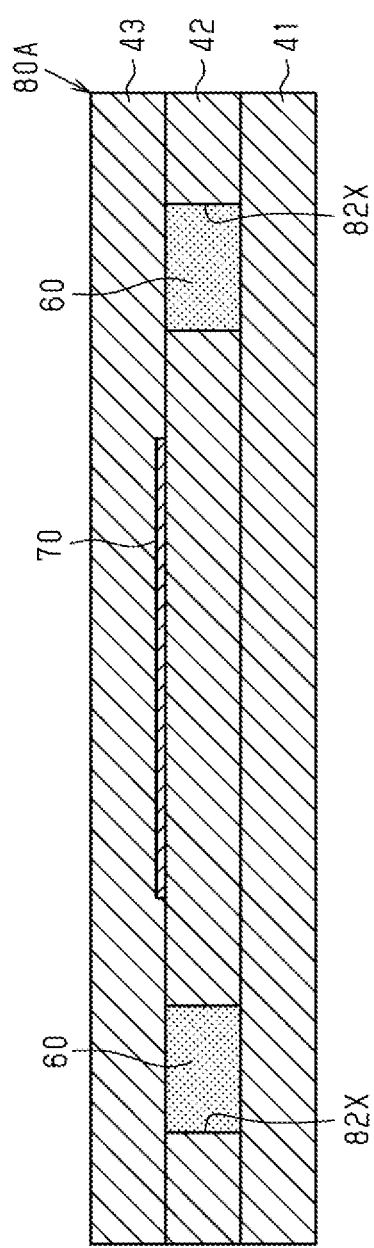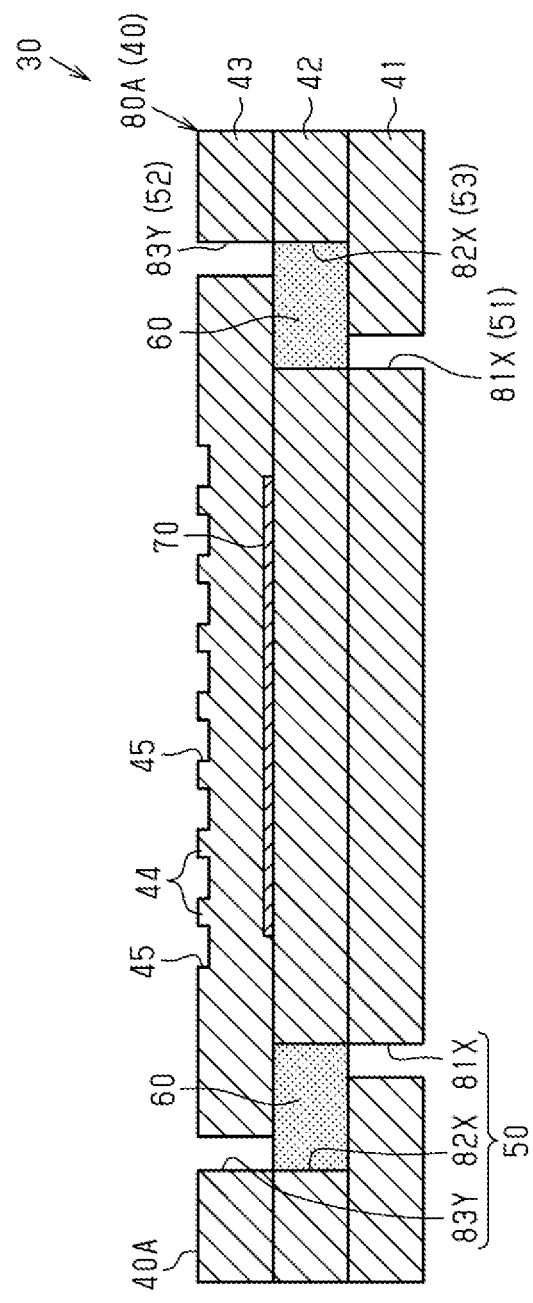
FIG. 12A
FIG. 12B

ELECTROSTATIC CHUCK AND SUBSTRATE FIXING DEVICE

CROSS-REFERENCE TO RELATED APPLICATIONS

This application is based on and claims the benefit of priority from prior Japanese patent application No. 2021-123156 filed on Jul. 28, 2021, the entire contents of which are incorporated herein by reference.

TECHNICAL FIELD

The present invention relates to an electrostatic chuck and a substrate fixing device.

BACKGROUND ART

In the related art, a film formation apparatus (for example, a CVD apparatus, a PVD apparatus, and the like) and a plasma etching apparatus that are used when manufacturing a semiconductor device as an IC and an LSI have a stage for accurately holding a substrate (for example, a silicon wafer) in a vacuum treatment chamber. As such a stage, for example, suggested is a substrate fixing device configured to suck and hold a wafer by an electrostatic chuck mounted on a base plate, for example.

The substrate fixing device has, for example, a metal base plate (base), an electrostatic chuck joined on the base plate, and an electrostatic electrode built in the electrostatic chuck. In addition, the substrate fixing device has a gas supply part for cooling the wafer. The gas supply part supplies a gas to a surface of the electrostatic chuck via a gas flow path provided in the base plate and a gas hole provided in the electrostatic chuck (for example, refer to PTL 1).

CITATION LIST

Patent Document

PTL 1: JP-A-2013-232640

SUMMARY INVENTION

In the substrate fixing device of the related art, when high frequency power is supplied to the metal base plate to generate plasma on the surface of the wafer in a state where the wafer is placed on the electrostatic chuck, abnormal electric discharge may occur in the gas supply part.

An embodiment of the present disclosure relates to an electrostatic chuck. The electrostatic chuck includes:

an insulating substrate having a placement surface on which a suction target object is placed and an opposite surface provided on an opposite side to the placement surface; and a gas hole penetrating from the opposite surface to the placement surface, wherein the gas hole has a first hole portion extending from the opposite surface toward the placement surface, a second hole portion extending from the placement surface toward the opposite surface, and a third hole portion provided between the first hole portion and the second hole portion and formed to communicate the first hole portion and the second hole portion each other, and wherein the first hole portion is provided not to overlap with the second hole portion in a plan view.

According to one aspect of the present invention, it is possible to obtain an effect capable of suppressing occurrence of abnormal electric discharge.

BRIEF DESCRIPTION OF DRAWINGS

FIG. 1A. is a schematic cross-sectional view showing a substrate fixing device according to a first embodiment.

FIG. 1B is an enlarged cross-sectional view (a cross-sectional view taken along a line 1b-1b in FIG. 2) showing a part of the substrate fixing device shown in FIG. 1A.

FIGS. 3A and 3B are schematic cross-sectional views showing a manufacturing method of an electrostatic chuck according to the first embodiment.

FIGS. 5A and 5B are schematic cross-sectional views showing the manufacturing method of the electrostatic chuck according to the first embodiment.

FIGS. 6A and 6B are schematic cross-sectional views showing the manufacturing method of the electrostatic chuck according to the first embodiment.

FIGS. 7A and 7B are schematic cross-sectional views showing a manufacturing method of an electrostatic chuck according to a second embodiment.

FIGS. 10A and 10B are schematic cross-sectional views showing a manufacturing method of an electrostatic chuck according to a third embodiment.

FIGS. 12A and 12B are schematic cross-sectional views showing the manufacturing method of the electrostatic chuck according to the third embodiment.

DESCRIPTION OF EMBODIMENTS

Figure 2:
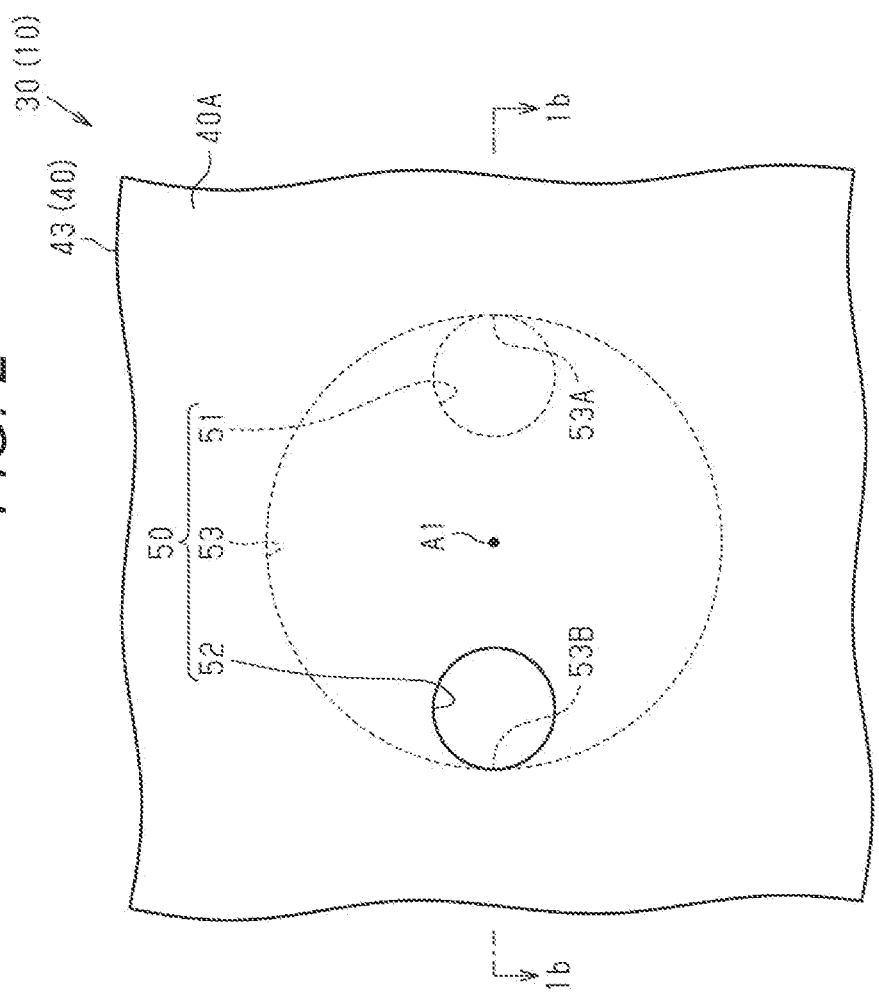
FIG. 2 is a schematic plan view showing a part of the substrate fixing device according to the first embodiment.

Hereinafter, each embodiment will be described with reference to the accompanying drawings. Note that, for convenience sake, in the accompanying drawings, a characteristic part is enlarged so as to easily understand the feature, and the dimension ratios of the respective constitutional elements may be different in the respective drawings. Further, in the cross-sectional views, hatching of some members is shown in a satin form, and hatching of some members is omitted so as to easily understand a sectional structure of each member. Note that, in the present specification, 'in a plan view' means seeing a target object from a vertical direction in FIG. 1A and the like (an upper and lower direction in the drawings), and 'a planar shape' means a shape of the target object seen from the vertical direction in FIG. 1A and the like. In the present specification, the 'upper and lower direction' and the 'right and left direction' are directions when a direction in which the reference numeral indicating each member can be correctly read in each drawing is set as a normal position.

First Embodiment

In the below, a first embodiment is described with reference to FIGS. 1A to 6B.

Configuration of Substrate Fixing Device 10

As shown in FIG. 1A, a substrate fixing device 10 has a base plate 20, and an electrostatic chuck 30 arranged on the base plate 20. The electrostatic chuck 30 is bonded to an upper surface of the base plate 20 by an adhesive such as silicone resin. Note that, the electrostatic chuck 30 may also be fixed to the base plate 20 by a screw. A suction target object (not shown) is placed on an upper surface of the electrostatic chuck 30. The suction target object is, for example, a substrate such as a semiconductor wafer. The substrate fixing device 10 is configured to suck and hold the suction target object placed on the electrostatic chuck 30.

Configuration of Base Plate 20

A shape and a size of the base plate 20 can be formed into arbitrary shape and size. The base plate 20 is formed into a disk shape, for example, in conformity to a shape of the suction target object placed on the electrostatic chuck 30. A diameter of the base plate 20 may be, for example, about 150 mm to 500 mm. A thickness of the base plate 20 may be, for example, about 10 mm to 50 mm. Here, in the present specification, the 'disk shape' refers to a planar shape having a circular shape and a predetermined thickness. Note that, in the 'disk shape', the thickness with respect to the diameter does not matter. In addition, it is assumed that a shape where a concave portion or a convex portion is partially formed is also included in the 'disk shape'.

As a material of the base plate 20, for example, a metal material such as aluminum or cemented carbide, a composite material of the metal material and a ceramic material, or the like can be used. In the present embodiment, from standpoints of easy availability, easy processing, favorable thermal conductivity and the like, aluminum or an aluminum alloy whose surface has been subjected to an alumite treatment (insulating layer formation) is used.

Configuration of Gas Flow Path 21

The base plate 20 has a gas flow path 21 penetrating through the base plate 20 in a thickness direction (upper and lower direction in the drawings). The gas flow path 21 is supplied with, for example, a gas for cooling the suction target object placed on the electrostatic chuck 30. As the gas for cooling, an inert gas may be used. As the inert gas, for example, a helium (He) gas, an argon (Ar) gas, or the like may be used. The gas flow path 21 is formed to penetrate from the upper surface of the base plate 20 connected to the electrostatic chuck 30 to a lower surface on an opposite side to the upper surface.

The gas flow path 21 has a gas flow path portion 22 formed on the lower surface of the base plate 20, a plurality of gas flow path portions 23 formed on the upper surface of the base plate 20, and a gas flow path portion 24 configured to communicate the gas flow path portion 22 and the gas flow path portions 23 each other.

The gas flow path portion 22 is formed to open below the base plate 20. The gas flow path portion 22 is formed to extend from the lower surface toward the upper surface of the base plate 20 along the thickness direction of the base plate 20, for example. A lower end portion of the gas flow path portion 22 is an introduction port (inflow port) of the gas flow path 21 into which the inert gas is introduced from a gas supply source (not shown).

Each gas flow path portion 23 is formed to open above the base plate 20. Each gas flow path portion 23 is formed to extend from the upper surface toward the lower surface of the base plate 20 along the thickness direction of the base plate 20, for example. An upper end portion of each gas flow path portion 23 is a discharge port (outflow port) of the gas flow path 21 for discharging the inert gas introduced into the gas flow path 21. The plurality of gas flow path portions 23 are provided apart from each other in a planar direction orthogonal to the thickness direction of the base plate 20, in a cross-sectional view. The plurality of gas flow path portions 23 are scattered on the upper surface of the base plate 20, for example, in a plan view. The number of the gas flow path portions 23 can be appropriately determined as required. For example, the number of the gas flow path portions 23 can be about several tens to several hundreds.

The gas flow path portion 24 is formed to communicate, for example, the gas flow path portion 22 and the plurality of gas flow path portions 23. The gas flow path portion 24 is formed so that, for example, one gas flow path portion 22 is branched into the plurality of gas flow path portions 23. The gas flow path portion 24 has, for example, a flow path portion 24A extending in the planar direction from an upper end portion of the gas flow path portion 22, a flow path portion 24B extending in the thickness direction of the base plate 20 from an end portion of the flow path portion 24A, and a flow path portion 24C extending in the planar direction from an upper end portion of the flow path portion 24B. The flow path portion 24C of the present embodiment extends leftward from the upper end portion of the flow path portion 24B in the drawing and extends rightward from the upper end portion of the flow path portion 24B in the drawing. The flow path portion 24C is formed into an annular shape, in a plan view, for example. The flow path portion 24C is configured to communicate with the lower end portions of the plurality of gas flow path portions 23.

Configuration of Electrostatic Chuck 30

The electrostatic chuck 30 has an insulating substrate 40 and an electrostatic electrode 70 built in the insulating substrate 40.

Configuration of Insulating Substrate 40

A shape and a size of the insulating substrate 40 can be formed into arbitrary shape and size. The insulating substrate 40 is formed into a disk shape, for example, in conformity to the shape of the suction target object placed on the electrostatic chuck 30. A planar shape of the insulating substrate 40 is formed, for example, to have the same shape and size as the planar shape of the base plate 20. A diameter of the insulating substrate 40 may be, for example, about 150 mm to 500 mm. A thickness of the insulating substrate 40 may be, for example, about 1 mm to 5 mm. Note that, the size of the planar shape of the insulating substrate 40 may be smaller than the size of the planar shape of the base plate 20.

As a material of the insulating substrate 40, a material having an insulating property may be used. For example, as the material of the insulating substrate 40, ceramics such as aluminum oxide ($Al_2O_3$), aluminum nitride (AlN) and silicon nitride, and organic materials such as silicone resin and polyimide resin may be used. In the present embodiment, ceramics such as aluminum oxide and aluminum nitride are used as the material of the insulating substrate 40 from the standpoints of easy availability, easy processing and relatively high resistance to plasma and the like. That is, the insulating substrate 40 of the present embodiment is a ceramic substrate made of ceramics.

The insulating substrate 40 has, for example, a structure in which a plurality of layers (here, three layers) of insulating layers 41, 42, and 43 are laminated. Each of the insulating layers 41, 42, and 43 is, for example, a sintered body formed by sintering a green sheet made of a mixture of aluminum oxide and an organic material. In each drawing, an interface between the insulating layer 41 and the insulating layer 42 and an interface between the insulating layer 42 and the insulating layer 43 are shown by solid lines. The interfaces are formed by laminating a plurality of green sheets, and positions may be different depending on a laminated state, the interfaces may not be straight in a cross section, or the interfaces may not be clear.

The insulating substrate 40 has a placement surface 40A on which a suction target object is placed, and an opposite surface 40B provided on an opposite side to the placement surface 40A. The placement surface 40A is provided on, for example, an upper surface of the insulating layer 43. The placement surface 40A is formed with a plurality of embosses 44. The plurality of embosses 44 are provided side by side along the planar direction of the insulating substrate 40, for example. The plurality of embosses 44 are formed, for example, by providing a plurality of concave portions 45 concave from the upper surface of the insulating layer 43 toward the base plate 20. Each concave portion 45 is formed to extend from the upper surface of the insulating layer 43 to a mid-portion in the thickness direction of the insulating layer 43. The opposite surface 40B is provided on, for example, a lower surface of the insulating layer 41. The opposite surface 40B is joined to, for example, the upper surface of the base plate 20.

Configuration of Gas Hole 50

The insulating substrate 40 has a gas hole 50 penetrating from the opposite surface 40B to the placement surface 40A of the insulating substrate 40. The insulating substrate 40 has a plurality of gas holes 50. The plurality of gas holes 50 are provided corresponding to the plurality of gas flow path portions 23, respectively. The plurality of gas holes 50 are formed to communicate with the plurality of flow path portions 23, respectively. For example, an inert gas for cooling the suction target object placed on the placement surface 40A is introduced into each gas hole 50. For example, the inert gas is introduced into each gas hole 50 from each gas flow path portion 23.

Each gas hole 50 has a hole portion 51 extending from the opposite surface 40B toward the placement surface 40A, a hole portion 52 extending from the placement surface 40A toward the opposite surface 40B, and a hole portion 53 provided between the hole portion 51 and the hole portion 52 and formed to communicate the hole portion 51 and the hole portion 52.

Configuration of Hole Portion 51

The hole portion 51 is formed to open below the insulating substrate 40. The hole portion 51 is formed to communicate with the gas flow path 21, specifically, the gas flow path portion 23. The hole portion 51 is formed to extend from the opposite surface 40B of the insulating substrate 40 along the thickness direction (upper and lower direction in the drawing) of the insulating substrate 40, for example. The hole portion 51 is formed to linearly extend along the thickness direction of the insulating substrate 40. The hole portion 51 is formed to penetrate through the insulating layer 41 in the thickness direction, for example. An upper end portion of the hole portion 51 is formed to communicate with the hole portion 53. A shape and a size of the hole portion 51 may be formed into arbitrary shape and size.

As shown in FIG. 2, a planar shape of the hole portion 51 of the present embodiment is a circular shape. The planar shape of the hole portion 51 is formed smaller than a planar shape of the hole portion 53. That is, the hole portion 51 is a pore smaller than the hole portion 53. The hole portion 51 entirely overlaps with the hole portion 53 in a plan view, for example, Configuration of Hole Portion 52

As shown in FIG. 1B, the hole portion 52 is formed to open above the insulating substrate 40. The hole portion 52 is formed to extend from the placement surface 40A of the insulating substrate 40 along the thickness direction of the insulating substrate 40, for example. The hole portion 52 is formed to linearly extend along the thickness direction of the insulating substrate 40. The hole portion 52 is formed to penetrate through the insulating layer 43 in the thickness direction, for example. A lower end portion of the hole portion 52 is formed to communicate with the hole portion 53. An upper end portion of the hole portion 52 is a discharge port of the gas hole 50 that discharges the inert gas to an outside of the gas hole 50. A shape and a size of the hole portion 52 may be formed into arbitrary shape and size.

As shown in FIG. 2, a planar shape of the hole portion 52 of the present embodiment is a circular shape. The planar shape of the hole portion 52 is formed smaller than a planar shape of the hole portion 53. That is, the hole portion 52 is a pore smaller than the hole portion 53. An opening width (opening diameter) of the hole portion 52 may be equal to or different from an opening width (opening diameter) of the hole portion 51. For example, the opening width of the hole portion 52 may be smaller than the opening width of the hole portion 51. The hole portion 52 entirely overlaps with the hole portion 53 in a plan view, for example.

Configuration of Hole Portion 53

As shown in FIG. 1B, the hole portion 53 is provided between the hole portion 51 and the hole portion 52 in the thickness direction of the insulating substrate 40. The hole portion 53 is formed to extend in the planar direction of the insulating substrate 40. The hole portion 53 is provided in the insulating layer 42, for example. The hole portion 53 is provided to penetrate through the insulating layer 42 in the thickness direction, for example. A part of a lower end portion of the hole portion 53 is formed to communicate with the hole portion 51. A part of an upper end portion of the hole portion 53 is formed to communicate with the hole portion 52. A shape and a size of the hole portion 53 may be formed into arbitrary shape and size.

As shown in FIG. 2, a planar shape of the hole portion 53 of the present embodiment is a circular shape. The planar shape of the hole portion 53 is formed larger than the planar shapes of the hole portions 51 and 52. The planar shape of the hole portion 53 is formed twice or more as large as the planar shape of each of the hole portions 51 and 52, for example.

A diameter of the hole portion 53 may be, for example, about 5 mm to 6 mm, a diameter of the hole portion 51 may be, for example, about 2 mm to 3 mm, and a diameter of the hole portion 52 may be, for example, about 2 mm to 3 mm.

Positional Relationship of Hole Portions 51, 52 and 53

As shown in FIGS. 1B and 2, the hole portion 51 and the hole portion 52 are provided not to overlap with each other in a plan view. The hole portion 51 is provided so that the entire hole portion 51 does not overlap with the hole portion 52 in a plan view. In a plan view, the entire hole portion 51 overlaps with the hole portion 53, and the entire hole portion 52 overlaps with the hole portion 53. The hole portion 51 is provided, for example, near an inner peripheral surface of the hole portion 53, in a plan view. The hole portion 51 is provided so that a part of an inner peripheral surface of the hole portion 51 overlaps with a part of the inner peripheral surface of the hole portion 53, in a plan view, for example. The hole portion 52 is provided, for example, near the inner peripheral surface of the hole portion 53. The hole portion 52 is provided so that a part of an inner peripheral surface of the hole portion 52 overlaps with a part of the inner peripheral surface of the hole portion 53, in a plan view, for example. The hole portion 51 and the hole portion 52 are provided, for example, at positions farthest from each other within a range in which the entire hole portions 51 and 52 overlap with the hole portion 53 in a plan view. Here, the inner peripheral surface of the hole portion 53 has a first portion 53A, and a second portion 53B arranged point-symmetrically with the first portion 53A with respect to a central axis A1 of the hole portion 53, The central axis A1 passes through a plane center of the hole portion 53 and extends along the thickness direction of the insulating substrate 40. In the present embodiment, a part of the inner peripheral surface of the hole portion 51 overlaps with the first portion 53A in a plan view, and a part of the inner peripheral surface of the hole portion 52 overlaps with the second portion 53B in a plan view. For this reason, a distance between the inner peripheral surfaces farthest from each other in the hole portions 51 and 52 is equal to a distance between the first portion 53A and the second portion 53B in the planar direction, i.e., a diameter of the hole portion 53.

As shown in FIG. 1B, in a portion where the inner peripheral surfaces of the hole portions 51 and 53 overlap with each other in a plan view, the inner peripheral surface of the hole portion 51 and the inner peripheral surface of the hole portion 53 (i.e., the first portion 53A) are formed to extend continuously in the thickness direction of the insulating substrate 40. In addition, in a portion where the inner peripheral surfaces of the hole portions 52 and 53 overlap with each other in a plan view, the inner peripheral surface of the hole portion 52 and the inner peripheral surface of the hole portion 53 (i.e., the second portion 53B) are formed to extend continuously in the thickness direction of the insulating substrate 40.

The gas hole 50 is formed in a crank shape in a cross-sectional view. The cross-sectional shape of the gas hole 50 has a crank shape having two bent portions. That is, the cross-sectional shape of the gas hole 50 has a crank shape configured by the hole portion 51 extending upward from the opposite surface 40B, the hole portion 53 extending in the planar direction from the upper end portion of the hole portion 51, and the hole portion 52 extending upward from the hole portion 53 at a position offset from the hole portion 51 in a plan view. In the gas hole 50, the inert gas is introduced into the hole portion 51 through the gas flow path 21, and the inert gas flows into the hole portion 53 through the hole portion 51. Further, in the gas hole 50, the inert gas flowing into the hole portion 53 is moved in the planar direction in the hole portion 53 and then flows into the hole portion 52, and the inert gas is discharged from the gas hole 50 through the hole portion 52. The inert gas discharged from the hole portion 52 is filled between a lower surface of the suction target object placed on the placement surface 40A and the placement surface 40A, for example, thereby cooling the suction target object.

Configuration of Porous Body 60

In the gas hole 50, a porous body 60 having air permeability is provided. The porous body 60 is provided in the hole portion 53 of the gas hole 50, for example. The porous body 60 has pores in the porous body 60. The pores communicate with the hole portions 51 and 52 so that gas can pass from a lower side (hole portion 51-side) of the porous body 60 toward an upper side (hole portion 52-side) of the porous body 60. The porous body 60 is formed by, for example, providing a large number of ceramic beads such as alumina beads in the hole portion 53. As the porous body 60, for example, a glass fiber, a heat-resistant resin sponge, or the like may be used. The porous body 60 is not provided in the hole portions 51 and 52, for example.

Configuration of Electrostatic Electrode 70

As shown in FIG. 1A, the electrostatic electrode 70 is provided in the insulating substrate 40. The electrostatic electrode 70 is a conductor layer formed in a film shape, for example. The electrostatic electrode 70 is provided, for example, in a portion of the insulating substrate 40 located near the placement surface 40A. The electrostatic electrode portion 70 is formed on the upper surface of the insulating layer 42, for example. The electrostatic electrode 70 is provided to be sandwiched between the insulating layer 42 and the insulating layer 43, for example. The electrostatic electrode 70 is electrically connected to, for example, a suction power source (not shown). The electrostatic electrode 70 is configured to fix the suction target object on the placement surface 40A by an electrostatic force generated by a voltage applied from the suction power source. As a material of the electrostatic electrode 70. tungsten (W) or molybdenum (Mo) may be used, for example. Note that, although one electrostatic electrode 70 is shown in FIG. 1A, a plurality of electrodes actually arranged on the same plane are included.

Operations

Next, operations of the substrate fixing device 10 are described.

For example, in a state where the substrate fixing device 10 is arranged in a chamber (not shown), a suction target object is placed on the placement surface 40A of the electrostatic chuck 30. By introducing a raw material gas into the chamber and applying a high-frequency voltage to the base plate 20, plasma is generated to perform treatment on the suction target object (for example, a wafer). At this time, the inert gas such as He gas is introduced from the gas supply source (not shown) into the gas supply part configured by the gas flow path 21 and the gas hole 50. The inert gas sequentially passes through the gas flow path 21, the hole portion 51 of the gas hole 50, the porous body 60 in the hole portion 53, and the hole portion 52, and is supplied to the lower surface of the suction target object placed on the placement surface 40A. When plasma is generated in this way, an abnormal electric discharge may occur between the suction target object and the metal base plate 20. As a path of the abnormal electric discharge, as shown in FIG. 1B, a path R1 from a discharge port of the inert gas of the gas hole 50, i.e., the upper end portion of the hole portion 52 to the base plate 20 through an inside of the gas hole 50 may he exemplified. The path R1 is, for example, the shortest path from the upper end portion of the hole portion 52 to the upper surface of the base plate 20 through the inside of the gas hole 50.

Figure 14:
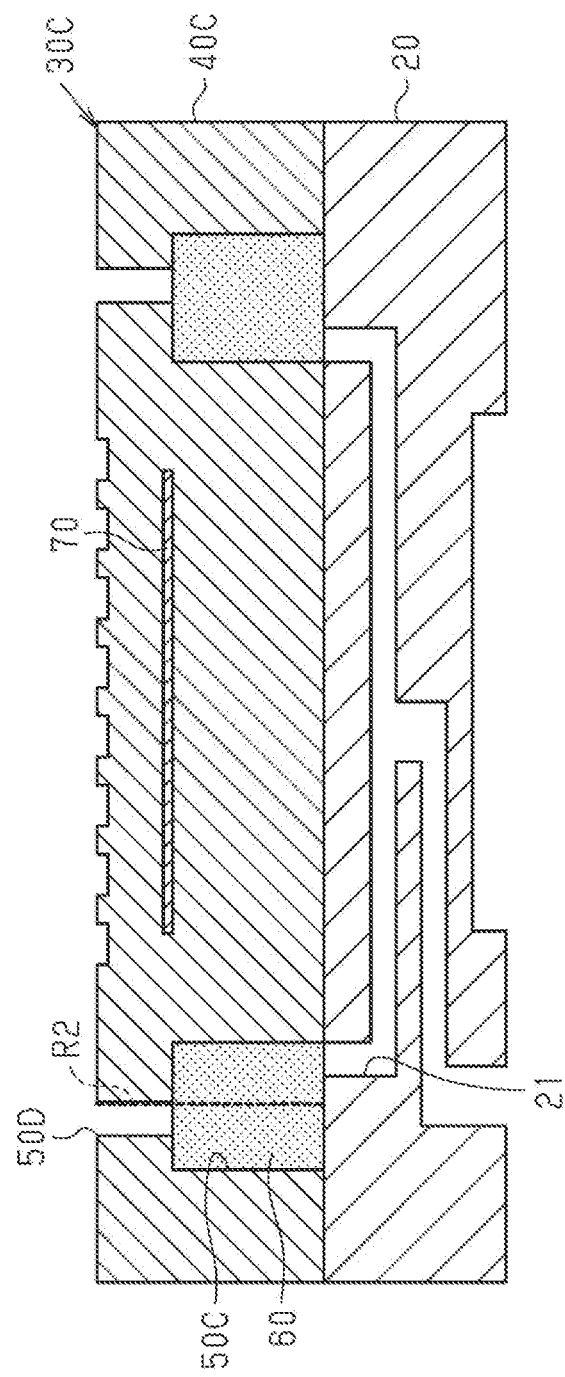
FIG. 14 is a schematic cross-sectional view showing a substrate fixing device according to Comparative Example.

Here, as in Comparative Example shown in FIG. 14, when a path R2 extending linearly from a discharge port 50D of a gas hole 50C to the upper surface of the base plate 20 along a thickness direction of an insulating substrate 40C (electrostatic chuck 30C) is present in the gas hole 50C, a length of the path R2 coincides with a thickness of the insulating substrate 40C. That is, the length of the abnormal electric discharge path R2 coincides with the dimension in the thickness direction of the insulating substrate 40C.

In contrast, as shown in FIG. 1B, in the electrostatic chuck 30 of the present embodiment, the hole portion 51 formed in the opposite surface 40B of the insulating substrate 40 and the hole portion 52 formed in the placement surface 40A are provided not to overlap with each other in a plan view. According to this configuration, the upper end portion of the hole portion 52, which is the discharge port of the gas hole 50, and the lower end portion of the hole portion 51 opening on the upper surface-side of the base plate 20 can be offset in the planar direction. For this reason, the length of the abnormal electric discharge path R1 can he made longer than the thickness of the insulating substrate 40 by an offset amount of the holes 51 and 52 in the planar direction. Specifically, the path R1 in the electrostatic chuck 30 of the present embodiment extends from the upper end portion of the hole portion 52 to the lower end portion of the hole portion 52 along the thickness direction of the insulating layer 43. The path R1 extends from the lower end portion of the hole portion 52 to the upper end portion of the hole portion 51 in the hole portion 53, for example. At this time, since the hole portion 51 and the hole portion 52 are provided to be offset from each other in a plan view, the shortest path from the lower end portion of the hole portion 52 to the upper end portion of the hole portion 51 extends in an oblique direction intersecting the thickness direction of the insulating layer 42. For this reason, the length of the path RI in the hole portion 53 becomes longer than the thickness of the insulating layer 42. The path R1 extends from the upper end portion of the hole portion 51 to the upper surface of the base plate 20 along the thickness direction of the insulating layer 41. In this way, the length of the path R1 becomes longer than the thickness of the insulating layers 41 to 43 (insulating substrate 40), and is longer than the path R2 of Comparative Example (refer to FIG. 14). Thereby, a probability of collision between the plasma staying in the gas hole 50 and the inert gas can be reduced, as compared to Comparative Example. As a result, the occurrence of abnormal electric discharge can be favorably suppressed, and the occurrence of dielectric breakdown and the like due to the abnormal electric discharge can be favorably suppressed.

Manufacturing Method of Substrate Fixing Device 10

Next, a manufacturing method of the substrate fixing device 10 is described. Here, a manufacturing method of the electrostatic chuck 30 is described in detail.

First, in a process shown in FIG. 3A, green sheets 81, 82 and 83 made of a ceramic material and an organic material are prepared. Each of the green sheets 81, 82 and 83 has a sheet shape in which aluminum oxide (alumina) is mixed with a binder, a solvent and the like, for example. A size of the planar shape of each of the green sheets 81, 82 and 83 corresponds to the size of the planar shape of the insulating substrate 40 shown in FIG. 1A.

The green sheet 83 becomes the insulating layer 43 shown in FIG. 1A by being fired in a process described later. The green sheet 83 is provided with a through-hole 83X penetrating through the green sheet 83 in the thickness direction. The through-hole 83X is provided at a position corresponding to the hole portion 52 shown in FIG. 1A. A size of the planar shape of the through-hole 83X is formed smaller than the size of the planar shape of the hole portion 52 shown in FIG. 1A. The green sheet 82 becomes the insulating layer 42 shown in FIG. 1A by being fired in a process described later. The green sheet 82 is provided with a through-hole 82X penetrating through the green sheet 82 in the thickness direction. The through-hole 82X is provided at a position corresponding to the hole portion 53 shown in FIG. 1A, A size of the planar shape of the through-hole 82X is set corresponding to the size of the planar shape of the hole portion 53 shown in FIG. 1A. The green sheet 81 becomes the insulating layer 41 shown in FIG. 1A by being fired in a process described later. No through-hole is formed in the green sheet 81. Note that, the through-holes 82X and 83X are formed by, for example, a laser machining method or a machining method.

Next, in a process shown in FIG. 3B, the green sheets 81, 82 and 83 are compressed in the thickness direction by pressurizing the green sheets 81, 82 and 83 while heating the same. By the present process, the dimensions of each of the green sheets 81, 82 and 83 in the thickness direction become smaller than those before the present process. By compressing each of the green sheets 81, 82 and 83 in the thickness direction in this way, it is possible to stably control an amount of shrinkage of each of the green sheets 81, 82 and 83 when firing each of the green sheets 81, 82 and 83 in a process described later.

Subsequently, in a process shown in FIG. 4A, a conductor pattern 71 is formed on an upper surface of the green sheet 82 by using a conductive paste by a printing method (screen printing), for example. The conductor pattern 71 becomes the electrostatic electrode 70 shown in FIG. 1A by being fired in a process described later. Note that, as the conductive paste, a paste including metal particles such as molybdenum or conductive ceramic particles, a binder and a solvent may be used. Note that, the conductor pattern 71 may also be formed on a lower surface of the green sheet 83.

Figure 4A:
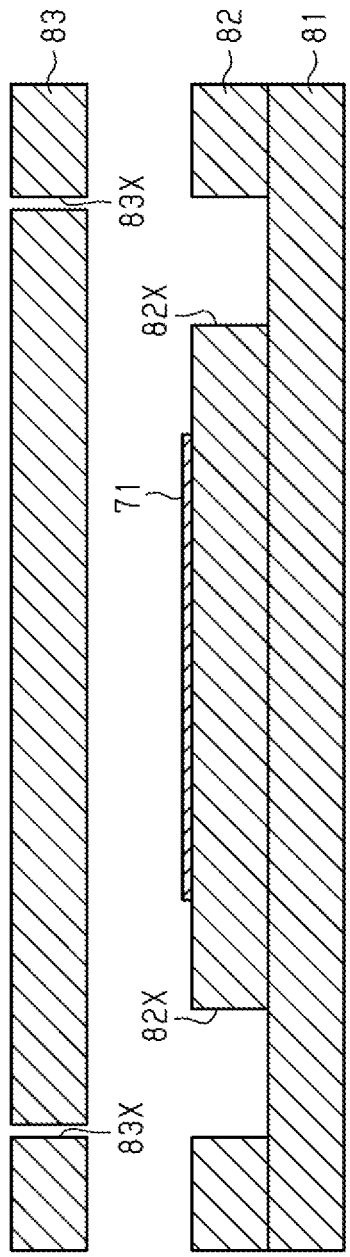
FIGS. 4A and 4B are schematic cross-sectional views showing the manufacturing method of the electrostatic chuck according to the first embodiment.

In addition, in a process shown in FIG. 4A, the green sheet 82 is arranged on the green sheet 81 in a state where the surface on which the conductor pattern 71 is formed faces upward. Then, the green sheets 81 and 82 are laminated. The green sheets 81 and 82 are joined to each other, for example, by pressurizing the green sheets while heating the same. By the present process, the opening on the lower side of the through-hole 82X of the green sheet 82 is closed by the green sheet 81.

Figure 4B:
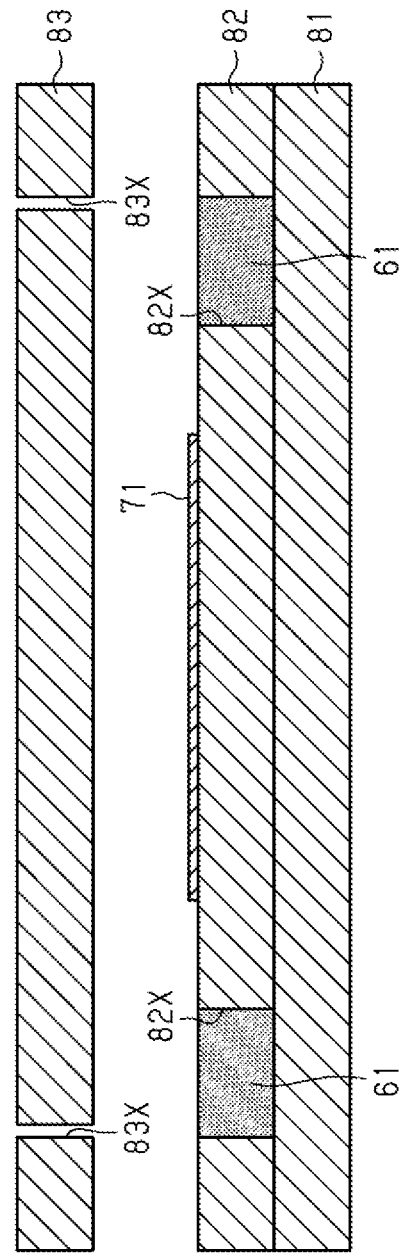

Next, in a process shown in FIG. 4B, a paste material 61, which is a precursor of the porous body 60 shown in FIG. 1A, is filled in the through-hole 82X by using a squeegee or the like. At this time, since the opening on one side (here, the lower side) of the through-hole 82X is closed by the green sheet 81, the paste material 61 can be easily filled in the through-hole 82X. The paste material 61 includes, for example, ceramic beads such as alumina beads constituting the porous body 60 shown in FIG. 1A. As the paste material 61, for example, a material including alumina beads, a binder and a solvent may be used.

Subsequently, in a process shown in FIG. 5A, the green sheet 83 is arranged on the green sheets 81 and 82 in the state where the green sheet 82 is arranged on the upper side. At this time, the green sheets 81, 82 and 83 are positionally aligned so that the through-hole 83X overlaps with the through-hole 82X in a plan view. Then, the green sheets 81, 82 and 83 are laminated to form a structure 80. The green sheets 81, 82 and 83 are joined to each other, for example, by pressurizing the green sheets while heating the same. By the present process, the conductor pattern 71 is embedded between the green sheet 82 and the green sheet 83, and the through-hole 83X and the through-hole 82X are made to communicate with each other.

Next, in a process shown in FIG. 5B, the structure 80 shown in FIG. 5A is fired. Thereby, the green sheets 81, 82 and 83 are sintered to become the insulating layers 41, 42 and 43, respectively, and a ceramic substrate 80A where the insulating layers 41, 42 and 43 are laminated is formed. The temperature at the time of firing is, for example, 1500° C. to 1600° C. By the firing in the present process, the organic component such as the solvent of the paste material 61 shown in FIG. 5A is volatilized, and the alumina beads of the paste material 61 are sintered. Thereby, a large number of alumina beads are provided in the through-hole 82X, and the porous body 60 is formed in the through-hole 82X. At this time, since the through-hole 83X is formed in the insulating layer 43, the gas generated by the volatilization of the organic component of the paste material 61 can be favorably discharged to an outside of the ceramic substrate 80A through the through-hole 83X. Thereby, it is possible to favorably suppress the insulating layers 41 and 43 from being deformed to bulge outward due to the above-described gas. Note that, the ceramic substrate 80A has therein the electrostatic electrode 70 obtained by sintering the conductor pattern 71 shown in FIG. 5A. Various processing is performed on the ceramic substrate 80A.

Next, in a process shown in FIG. 6A, a through-hole 81X penetrating through the insulating layer 41 in the thickness direction and communicating with the through-hole 82X is formed, and a through-hole 83Y penetrating through the insulating layer 43 in the thickness direction and communicating with the through-hole 82X is formed. Here, the through-hole 81X corresponds to the hole portion 51, the through-hole 82X corresponds to the hole portion 53, and the through-hole 83Y corresponds to the hole portion 52. Thereby, the gas hole 50 having the through-holes 81X, 82X and 83Y is formed in the ceramic substrate 80A. The through-hole 83Y is formed to increase the opening width of the through-hole 83X shown in FIG. 5B, for example. The through-hole 81X is formed not to overlap with the through-hole 83Y in a plan view. Note that, the through-holes 81X and 83Y are formed by, for example, a laser machining method or a machining method.

Subsequently, in a process shown in FIG. 6B, both the upper and lower surfaces of the ceramic substrate 80A are polished. Thereby, the upper surface of the ceramic substrate 80A is formed into the placement surface 40A. Next, a large number of concave portions 45 are formed on the placement surface 40A, and embosses 44 are formed on the placement surface 40A. Thereby, the insulating substrate 40 shown in FIG. 1A is obtained. Note that, the concave portions 45 are formed by, for example, a laser machining method or a machining method.

By the above manufacturing processes, the electrostatic chuck 30 can be manufactured.

In the present embodiment, the insulating layer 41 is an example of the first insulating layer, the insulating layer 42 is an example of the second insulating layer, the insulating layer 43 is an example of the third insulating layer, the hole portion 51 is an example of the first hole portion, the hole portion 52 is an example of the second hole portion, and the hole portion 53 is an example of the third hole portion. In addition, the green sheet 81 is an example of the first green sheet, the green sheet 82 is an example of the second green sheet, and the green sheet 83 is an example of the third green sheet. Further, the through-hole 82X is an example of the first through-hole, the through-hole 81X is an example of the second through-hole, the through-hole 83Y is an example of the third through-hole, and the through-hole 83X is an example of the fourth through-hole.

Effects

Next, the effects of the present embodiment are described.

(1) The hole portion 51 extending from the opposite surface 40B toward the placement surface 40A of the insulating substrate 40 and the hole portion 52 extending from the placement surface 40A toward the opposite surface 40B are provided not to overlap with each other in a plan view. According to this configuration, the upper end portion of the hole portion 52, which is the discharge port of the gas hole 50, and the lower end portion of the hole portion 51 opening on the upper surface-side of the base plate 20 can be offset in the planar direction. For this reason, the length of the abnormal electric discharge path RI can be made longer than the thickness of the insulating substrate 40 by an offset amount of the holes 51 and 52 in the planar direction. Thereby, a probability of collision between the plasma staving in the gas hole 50 and the inert gas can be reduced. As a result, the occurrence of abnormal electric discharge can be favorably suppressed, and the occurrence of dielectric breakdown and the like due to the abnormal electric discharge can be favorably suppressed.

(2) The planar shape of the hole portion 53 is formed larger than the planar shapes of the hole portions 51 and 52. According to this configuration, the offset amount between the hole portion 51 and the hole portion 52 in the planar direction can be easily increased in a state of overlapping with the hole portion 53 in a plan view. Thereby, the length of the abnormal electric discharge path R1 can be easily increased.

(3) The hole portion 51 is provided so that the entire hole portion 51 overlaps with the hole portion 53 and a part of the inner peripheral surface of the hole portion 51 overlaps with the first portion 53A of the inner peripheral surface of the hole portion 53 in a plan view. In addition, the hole portion 52 is provided so that the entire hole portion 52 overlaps with the hole portion 53 and a part of the inner peripheral surface of the hole portion 52 overlaps with the second portion 53B of the inner peripheral surface of the hole portion 53 in a plan view.

According to this configuration, the hole portion 51 and the hole portion 52 can be provided at positions farthest from each other within a range in which the entire hole portions 51 and 52 overlap with the hole portion 53 in a plan view, Thereby, the offset amount between the hole portion 51 and the hole portion 52 in the planar direction can be made larger, so that the length of the abnormal electric discharge path R1 can be made longer, Therefore, the occurrence of abnormal electric discharge can be more favorably suppressed.

(4) The porous body 60 is provided in the hole portion 53. Thereby, it is possible to suppress plasma from staying in the gas hole 50, particularly, the hole portion 53. As a result, the probability of collision between the plasma staying in the gas hole 50 and the inert gas can be reduced, so that the occurrence of abnormal electric discharge can be suppressed.

Second Embodiment

In the below, a second embodiment is described with reference to FIGS. 7A to 9B, In the present embodiment, the manufacturing method of the electrostatic chuck 30 is different from that of the first embodiment. In the below, the differences from the first embodiment are mainly described. The same members as those shown in FIGS. 1 to 6 are denoted with the same reference numerals, and the detailed description of each of the elements is omitted.

First, in a process shown in FIG. 7A, a green sheet 81 having a through-hole 81X, a green sheet 82 having a through-hole 82X, and a green sheet 83 having a through-hole 83Y are prepared. Here, the through-hole 81X is provided at a position corresponding to the hole portion 51 shown in FIG. 1A. A size of the planar shape of the through-hole 81X is set corresponding to the size of the planar shape of the hole portion 51 shown in FIG. 1A. The through-hole 83Y is provided at a position corresponding to the hole portion 52 shown in FIG. 1A. A size of the planar shape of the through-hole 83Y is set corresponding to the size of the planar shape of the hole portion 52 shown in FIG. 1A. The through-hole 81X and the through-hole 83Y are formed at positions where they do not overlap with each other in a plan view.

Next, in a process shown in 7B, the respective green sheets 81, 82 and 83 are compressed in the thickness direction by pressurizing the green sheets 81, 82 and 83 while heating the same.

Figure 8A:
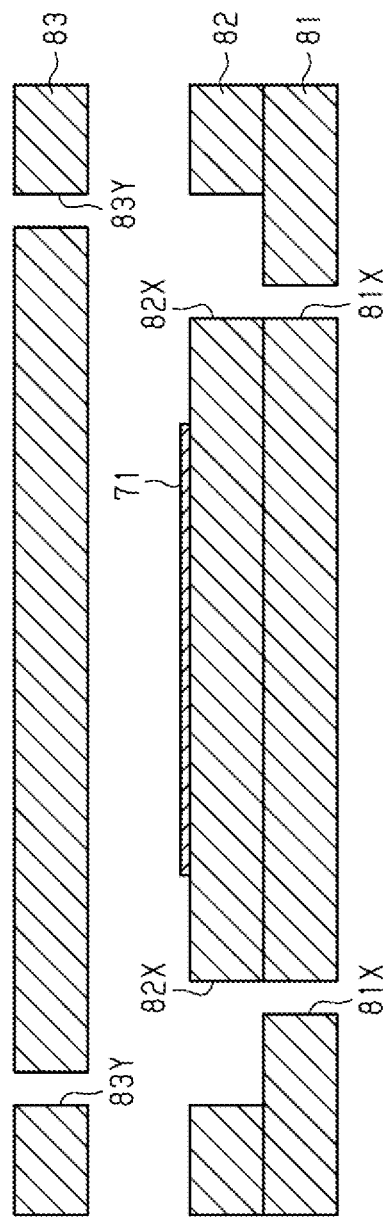
FIGS. 8A and 8B are schematic cross-sectional views showing the manufacturing method of the electrostatic chuck according to the second embodiment.

Subsequently, in a process shown in FIG. 8A, a conductor pattern 71 is formed on an upper surface of the green sheet 82 by a screen printing, for example. Note that, the conductor pattern 71 may also be formed on a lower surface of the green sheet 83.

In addition, in a process shown in FIG, 8A, the green sheet 82 is arranged on the green sheet 81 in a state where the surface on which the conductor pattern 71 is formed faces upward. At this time, the green sheets 81 and 82 are positionally aligned so that the through-hole 81X overlaps with the through-hole 82X in a plan view. Then, the green sheets 81 and 82 are laminated.

Figure 8B:
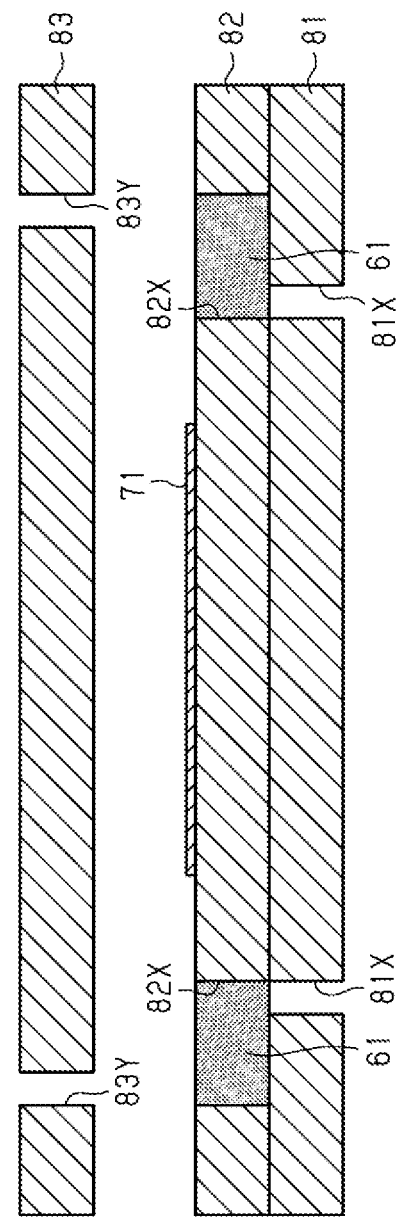

Next, in a process shown in FIG. 8B, a paste material 71 is filled in the through-hole 82X.

Subsequently, in a process shown in FIG. 9A, the green sheet 83 is arranged on the green sheets 81 and 82 in the state where the green sheet 82 is arranged on the upper side. At this time, the green sheets 81, 82 and 83 are positionally aligned so that the through-hole 83Y overlaps with the through-hole 82X in a plan view and the through-hole 83Y does not overlap with the through-hole 81X in a plan view. Then, the green sheets 81, 82 and 83 are laminated to form a structure 80.

Figure 9A:
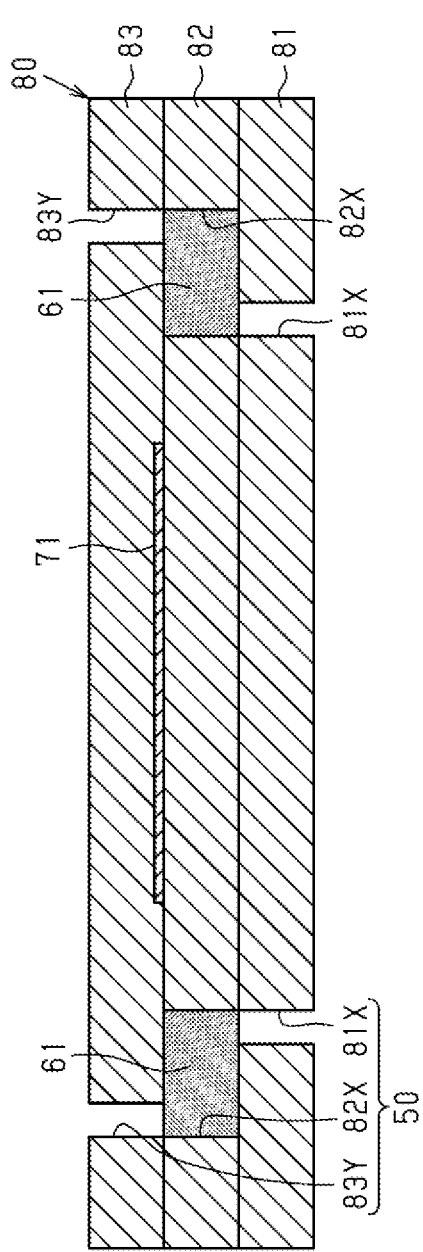
FIGS. 9A and 9B are schematic cross-sectional views showing the manufacturing method of the electrostatic chuck according to the second embodiment.
Figure 9B:
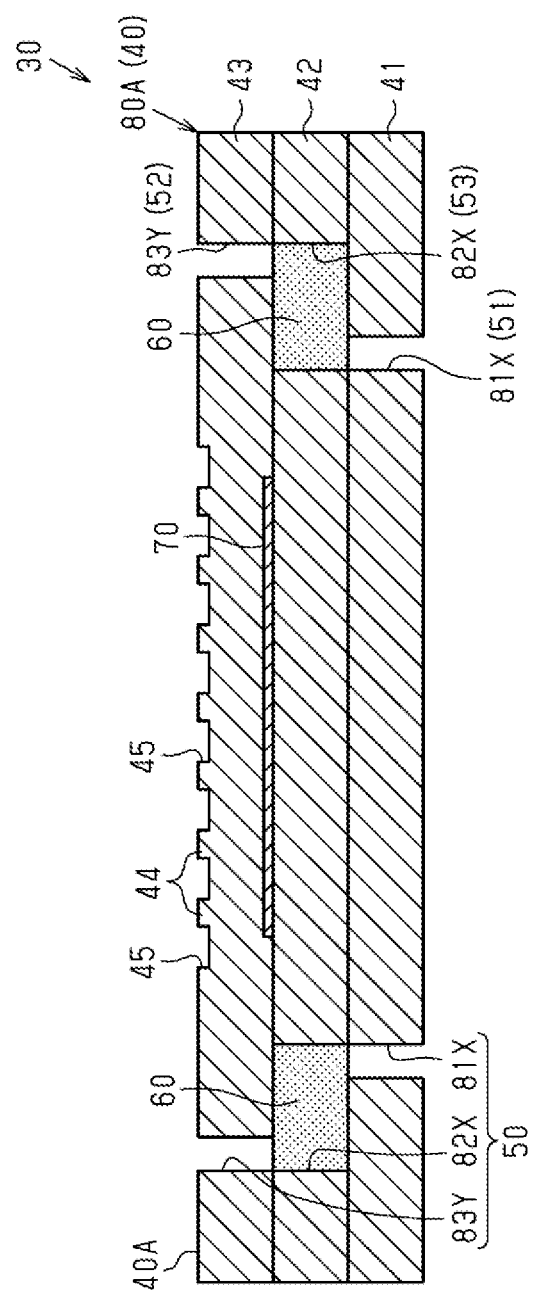

Next, in a process shown in FIG. 9B, a structure 80 shown in FIG. 9A is fired. Thereby, the green sheets 81, 82 and 83 are sintered to become the insulating layers 41, 42 and 43, respectively, and a ceramic substrate 80A where the insulating layers 41, 42 and 43 are laminated is formed. By the firing in the present process, the organic component such as the solvent of the paste material 61 shown in FIG. 9A is volatilized, and the alumina beads of the paste material 61 are sintered. Thereby, the porous body 60 having a large number of alumina beads is formed in the through-hole 82X. At this time, since the through-holes 81X and 83Y are formed in the insulating layers 41 and 43, the gas generated by the volatilization of the organic component of the paste material 61 can be favorably discharged to the outside of the ceramic substrate 80A through the through-holes 41X and 83Y. Thereby, it is possible to favorably suppress the insulating layers 41 and 43 from being deformed to bulge outward due to the above-described gas. By the present process, the gas hole 50 having the through-holes 81X, 82X and 83Y is formed in the ceramic substrate 80A. At this time, the through-hole 81X corresponds to the hole portion 51, the through-hole 82X corresponds to the hole portion 53, and the through-hole 83Y corresponds to the hole portion 52.

Thereafter, both the upper and lower surfaces of the ceramic substrate 80A are polished. Thereby, the upper surface of the ceramic substrate 80A is formed into the placement surface 40A. Next, a large number of concave portions 45 are formed on the placement surface 40A, and embosses 44 are formed on the placement surface 40A. Thereby, the insulating substrate 40 and the electrostatic chuck 30 can be manufactured.

According to the embodiment described above, the same effects as the effects (1) (4) of the first embodiment can be obtained.

Third Embodiment

In the below, a third embodiment is described with reference to FIGS. 10A to 12B. in the present embodiment, the manufacturing method of the electrostatic chuck 30 is different from that of the first embodiment. In the below, the differences from the first embodiment are mainly described. The same members as those shown in FIGS. 1 to 9 are denoted with the same reference numerals, and the detailed description of each of the elements is omitted.

First, in a process shown in FIG. 10A, a green sheet 81, a green sheet 82 having a through-hole 82X, and a green sheet 83 are prepared. Here, no through-hole is formed in the green sheets 81 and 83.

Next, in a process shown in FIG. 10B, the respective green sheets 81, 82 and 83 are compressed in the thickness direction by pressurizing the green sheets 81, 82 and 83 while heating the same.

Figure 11A:
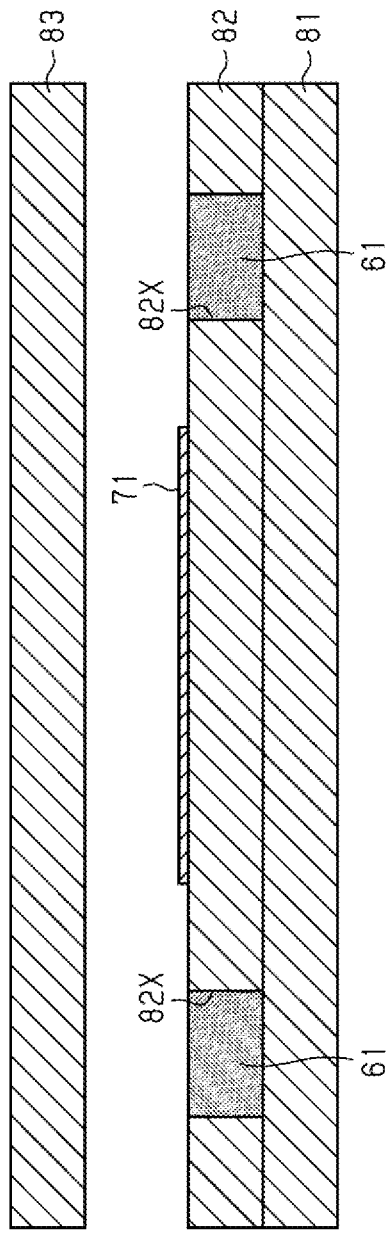
FIGS. 11A and 11B are schematic cross-sectional views showing the manufacturing method of the electrostatic chuck according to the third embodiment.

Subsequently, in a process shown in FIG. 11A, a conductor pattern 71 is formed on an upper surface of the green sheet 82 by a screen printing, for example. Note that, the conductor pattern 71 may also be formed on a lower surface of the green sheet 83.

Next, the green sheet 82 is laminated on the green sheet 81 in a state where the surface on which the conductor pattern 71 is formed faces upward.

Next, the paste material 61 is filled in the through-hole 82X. At this time, since the opening on one side here, the lower side)) of the through-hole 82X is closed by the green sheet 81, the paste material 61 can be easily filled in the through-hole 82X.

Subsequently, in a process shown in FIG. 11B, the green sheet 83 is arranged on the green sheets 81 and 82 in the state where the green sheet 82 is arranged on the upper side. Then, the green sheets 81, 82 and 83 are laminated to form a structure 80.

Figure 11B:
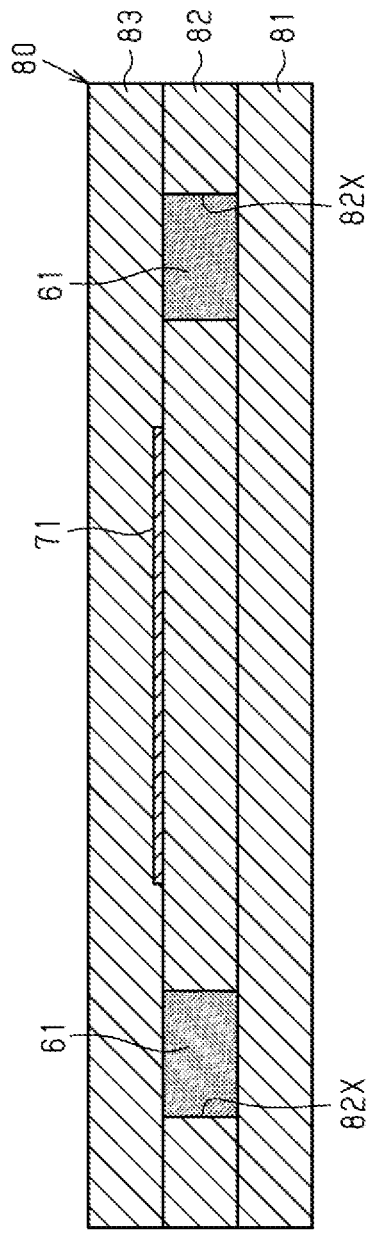

Next, in a process shown in FIG. 12A, a structure 80 shown in FIG. 11B is fired. Thereby, the green sheets 81, 82 and 83 are sintered to become the insulating layers 41, 42 and 43, respectively, and a ceramic substrate 80A where the insulating layers 41, 42 and 43 are laminated is formed. By the firing of the present process, the porous body 60 is formed from the paste material 61 shown in FIG. 11B, in the through-hole 82X.

Next, in a process shown in FIG. 12B, a through-hole 81X penetrating through the insulating layer 41 in the thickness direction and communicating with the through-hole 82X is formed, and a through-hole 83Y penetrating through the insulating layer 43 in the thickness direction and communicating with the through-hole 82X is formed. Here, the through-hole 81X corresponds to the hole portion 51, the through-hole 82X corresponds to the hole portion 53, and the through-hole 83Y corresponds to the hole portion 52. Thereby, the gas hole 50 having the through-holes 81X, 82X and 83Y is formed in the ceramic substrate 80A.

Thereafter, both the upper and lower surfaces of the ceramic substrate 80A are polished. Thereby, the upper surface of the ceramic substrate 80A is formed into the placement surface 40A. Next, a large number of concave portions 45 are formed on the placement surface 40A, and embosses 44 are formed on the placement surface 40A. Thereby, the insulating substrate 40 and the electrostatic chuck 30 can be manufactured.

According to the embodiment described above, the same effects as the effects (1) to (4) of the first embodiment can be obtained.

Other Embodiments

Each of the above embodiments can be changed and implemented, as follows. Each of the above embodiments and the following modified embodiments can be implemented in combination with each other within a technically consistent range.

In each of the above embodiments, the hole portion 51 is provided so that a part of the inner peripheral surface of the hole portion 51 overlaps with the first portion 53A of the inner peripheral surface of the hole portion 53 in a plan view. However, the formation position of the hole portion 51 is not particularly limited.

Figure 13:
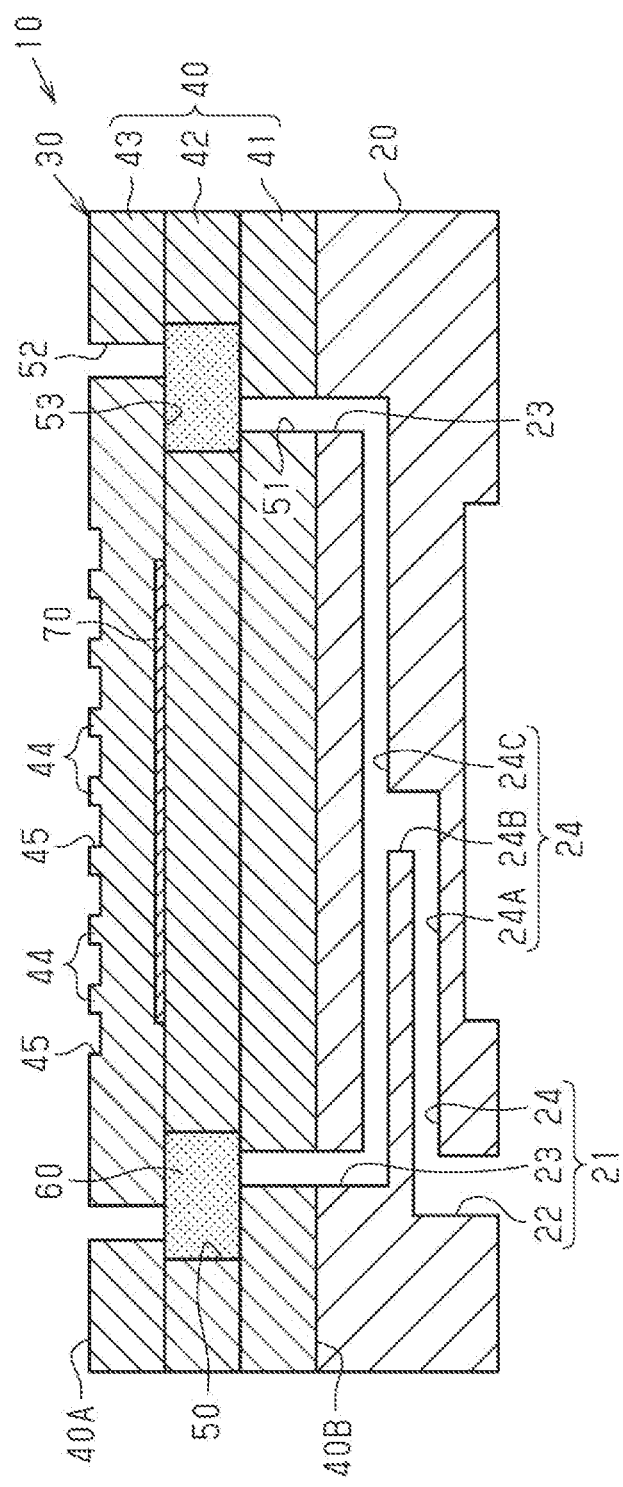
FIG. 13 is a schematic cross-sectional view showing a substrate fixing device according to a modified embodiment.

For example, as shown in FIG. 13, the hole portion 51 may be provided at a position overlapping with the hole portion 53 in a plan view and apart from the inner peripheral surface of the hole portion 53.

In each of the above embodiments, the hole portion 52 is provided so that a part of the inner peripheral surface of the hole portion 52 overlaps with the second portion 53B of the inner peripheral surface of the hole portion 53 in a plan view. However, the formation position of the hole portion 52 is not particularly limited.

For example, as shown in FIG. 13, the hole portion 52 may be provided at a position overlapping with the hole portion 53 in a plan view and apart from the inner peripheral surface of the hole portion 53.

In each of the above embodiments, the entire hole portion 51 is provided to overlap with the hole portion 53 in a plan view. However, the present invention is not limited thereto. For example, only a part of the hole portion 51 may overlap with the hole portion 53 in a plan view. That is, the hole portion 51 and the hole portion 53 may be provided to partially overlap with each other in a plan view.

In each of the above embodiments, the entire hole portion 52 is provided to overlap with the hole portion 53 in a plan view. However, the present invention is not limited thereto. For example, only a part of the hole portion 52 may overlap with the hole portion 53 in a plan view. That is, the hole portion 52 and the hole portion 53 may be provided to partially overlap with each other in a plan view.

In each of the above embodiments, the insulating layer 41 and the insulating layer 42 may be bonded to each other by an adhesive layer. In addition, the insulating layer 42 and the insulating layer 43 may be bonded to each other by an adhesive layer.

In each of the above embodiments, the insulating substrate 40 has such a structure that the three layers of the insulating layers 41, 42 and 43 are laminated. However, the present invention is not limited thereto. For example, the insulating substrate 40 may have a structure where four or more insulating layers are laminated. For example, the insulating substrate 40 may be embodied into a structure where four insulating layers are laminated, and the hole portion 53 may be formed to penetrate through the two insulating layers in the thickness direction.

In each of the above embodiments, the gas hole 50 is formed into a structure having one crank shape in a cross-sectional view. However, the shape of the gas hole 50 is not particularly limited. For example, the gas hole 50 may be formed into a structure where two or more crank shapes are continuous in a cross-sectional view.

In each of the above embodiments, the structure of the electrostatic chuck 30 is not particularly limited. For example, the insulating substrate 40 may be provided therein with a heat generating body (heater) configured to generate heat by applying a voltage from an outside of the substrate fixing device 10 and to perform heating so that the placement surface 40A of the insulating substrate 40 becomes a predetermined temperature.

In each of the above embodiments, the structure of the base plate 20 is not particularly limited. For example, the shape of the gas flow path 21 is not particularly limited. In addition, a heater may be provided in the base plate 20.

In each of the above embodiments, the embosses 44 on the placement surface 40A may be omitted.

In each of the above embodiments, the substrate fixing device 10 is applied to a semiconductor manufacturing apparatus, for example, a dry etching apparatus. Examples of the dry etching apparatus include a parallel flat plate type reactive ion etching (RIE) apparatus. Further, the substrate fixing device 10 can also be applied to a semiconductor manufacturing apparatus such as a plasma CVD (Chemical Vapor Deposition) apparatus and a sputtering apparatus.

This disclosure further encompasses various exemplary embodiments, for example, described below.

[1] A manufacturing method of an electrostatic chuck, the manufacturing method comprising:
preparing a first green sheet, a second green sheet having a first through-hole, and a third green sheet;
laminating the second green sheet on the first green sheet;
filling a paste material including ceramic beads and a solvent in the first through-hole;

laminating the third green sheet on the second green sheet;

firing the first green sheet, the second green sheet and the third green sheet laminated on each other;

forming a second through-hole penetrating through the first green sheet in a thickness direction; and forming a third through-hole penetrating through the third green sheet in the thickness direction, wherein in the firing, the solvent is volatilized and the ceramic beads are sintered, so that a porous body is formed in the first through-hole, wherein the first through-hole is formed to communicate the second through-hole and the third through-hole each other, and wherein the second through-hole and the third through-hole are formed not to overlap with each other in a plan view.

[2] The manufacturing method of an electrostatic chuck according to [1], comprising:

forming a fourth through-hole penetrating through the third green sheet in the thickness direction, before laminating the third green sheet on the second green sheet;

wherein after the firing, the forming of the second through-hole and the forming of the third through-hole are performed, and wherein in the forming of the third through-hole, the third through-hole is formed to increase an opening width of the fourth through-hole.

[3] The manufacturing method of an electrostatic chuck according to [1], wherein the forming of the second through-hole is performed, before laminating the second green sheet on the first green sheet, and wherein the forming of the third through-hole is performed, before laminating the third green sheet on the second green sheet.

What is claimed is:

1. An electrostatic chuck comprising:
   an insulating substrate having a placement surface on which a suction target object is placed and an opposite surface provided on an opposite side to the placement surface; and
   a gas hole penetrating from the opposite surface to the placement surface,
   wherein the gas hole has a first hole portion extending from the opposite surface toward the placement surface, a second hole portion extending from the placement surface toward the opposite surface, and a third hole portion provided between the first hole portion and the second hole portion and formed to communicate the first hole portion and the second hole portion each other,
   wherein the first hole portion is provided not to overlap with the second hole portion in a plan view,
   wherein the insulating substrate has a first insulating layer having the opposite surface, a second insulating layer laminated on the first insulating layer, and a third insulating layer having the placement surface and laminated on the second insulating layer,
   wherein the first hole portion penetrates through the first insulating layer in a thickness direction,
   wherein the second hole portion penetrates through the third insulating layer in the thickness direction, and
   wherein the third hole portion penetrates through the second insulating layer in the thickness direction.

2. The electrostatic chuck according to claim 1, wherein the third hole portion has a larger planar shape than the first hole portion and the second hole portion.

3. The electrostatic chuck according to claim 2, wherein the first hole portion is provided so that the entire first hole portion overlaps with the third hole portion in a plan view, and
   wherein the second hole portion is provided so that the entire second hole portion overlaps with the third hole portion in a plan view.

4. The electrostatic chuck according to claim 3, wherein an inner peripheral surface of the third hole portion has a first portion and a second portion arranged point-symmetrically with the first portion with respect to a central axis of the third hole portion,
   wherein the first hole portion is provided so that a part of an inner peripheral surface of the first hole portion overlaps with the first portion in a plan view, and
   wherein the second hole portion is provided so that a part of an inner peripheral surface of the second hole portion overlaps with the second portion in a plan view.

5. The electrostatic chuck according to claim 1, further comprising:
   a porous body provided in the third hole portion.

6. A substrate fixing device comprising:
   the electrostatic chuck according to claim 1; and
   a base plate joined to the opposite surface of the electrostatic chuck.

* * * * *